(12) United States Patent
Kim

(10) Patent No.: US 11,181,763 B2
(45) Date of Patent: Nov. 23, 2021

(54) DISPLAY DEVICE

(71) Applicant: Samsung Display Co., Ltd., Yongin-si (KR)

(72) Inventor: Minsoo Kim, Seoul (KR)

(73) Assignee: Samsung Display Co., Ltd., Yongin-si (KR)

(\*) Notice: Subject to any disclaimer, the term of this patent is extended or adjusted under 35 U.S.C. 154(b) by 353 days.

(21) Appl. No.: 15/648,058

(22) Filed: Jul. 12, 2017

(65) Prior Publication Data

US 2018/0081219 A1   Mar. 22, 2018

(30) Foreign Application Priority Data

Sep. 21, 2016 (KR) .................. 10-2016-0120947

(51) Int. Cl.
| | |
|---|---|
| *G02F 1/1333* | (2006.01) |
| *G06F 1/16* | (2006.01) |
| *H01L 27/32* | (2006.01) |
| *G06F 3/044* | (2006.01) |
| *G02F 1/136* | (2006.01) |
| *G02F 1/05* | (2006.01) |

(52) U.S. Cl.
CPC .......... *G02F 1/13338* (2013.01); *G02F 1/136* (2013.01); *G02F 1/133305* (2013.01); *G06F 1/1616* (2013.01); *G06F 1/1643* (2013.01); *G06F 1/1652* (2013.01); *G06F 3/0446* (2019.05); *H01L 27/323* (2013.01); *G02F 1/0541* (2013.01)

(58) Field of Classification Search
CPC .......... G02F 1/13338; G02F 1/133305; G02F 1/136; G02F 1/0541; G06F 1/1616; G06F 3/044; H01L 27/323
See application file for complete search history.

(56) References Cited

U.S. PATENT DOCUMENTS

| | | | |
|---|---|---|---|
| 9,046,975 B2 | 6/2015 | Kang et al. | |
| 9,246,486 B2 | 1/2016 | Yang et al. | |
| 2015/0346863 A1\* | 12/2015 | Morita .................. | G06F 3/0416 345/174 |
| 2016/0188098 A1\* | 6/2016 | Her ....................... | G06F 1/1652 345/173 |
| 2018/0107298 A1\* | 4/2018 | Zhang .................. | G06F 3/0443 |

FOREIGN PATENT DOCUMENTS

| | | |
|---|---|---|
| KR | 10-20140118280 A | 10/2014 |
| KR | 10-1654602 B1 | 9/2016 |

\* cited by examiner

*Primary Examiner* — Que Tan Le
*Assistant Examiner* — Don J Williams
(74) *Attorney, Agent, or Firm* — H.C. Park & Associates, PLC

(57) ABSTRACT

A display device including a display panel having a first area, a second area spaced from the first area, and a bending area disposed between the first and second areas, a first sensing pattern overlapped with the first area, a second sensing pattern spaced apart from the first sensing pattern and overlapped with the second area, and a first non-functional pattern overlapped with the bending area and spaced apart from each of the first and second sensing patterns.

18 Claims, 12 Drawing Sheets

DISPLAY DEVICE

CROSS-REFERENCE TO RELATED APPLICATION

This application claims priority from and the benefit of Korean Patent Application No. 10-2016-0120947, filed on Sep. 21, 2016, which is hereby incorporated by reference for all purposes as if fully set forth herein.

BACKGROUND

Field

The invention relates generally to a display device, and, more particularly, to a flexible display device that is bendable and includes a dummy pattern to reduce the visibility of internal components to a user.

Discussion of the Background

A touch screen panel is an input device, allowing for a user to select content displayed on a screen and to input a user command or selection using a hand or an object.

The touch screen panel is provided on an image display device and is configured to generate an electrical signal containing information regarding a position which is in direct contact with the hand or object. Content displayed at the contact position is selected in response to an input signal.

The touch screen panel replaces an additional input device such as a keyboard or a mouse, for example, which is connected to the image display device. Thus, the range of applications for the touch screen panel is gradually expanding.

There are a variety of technologies for touch screen panels. For example, a method of using a resistive layer, an optical sensing method, and a capacitance sensing method are being used for touch screen panels. In particular, for the capacitive sensing method, the touch screen panel is configured to measure a change in electrostatic capacitance between a conductive sensing pattern and another sensing pattern (or a ground electrode), which may occur when a hand or an object is in contact with the touch screen panel and to convert the measured result to an electrical signal containing information regarding a contact position.

The touch screen panel is usually attached to an outer surface of an image display device, and, the image display device may be a liquid crystal display device, an organic electric field light-emitting display device, and so on. Accordingly, there is an increasing demand for a touch screen panel with high transparency and thin thickness. Moreover, there has been an increase in demand for flexible, touch screen displays that are bendable in one or more areas of the display.

The above information disclosed in this Background section is only for enhancement of understanding of the background of the inventive concepts, and, therefore, it may contain information that does not form the prior art that is already known in this country to a person of ordinary skill in the art.

SUMMARY

Applicants have discovered that repeated bending of a display, especially about one folding line or in a narrow range of folding lines in one bending area, can cause damage to the electrodes and other components of the device in the bending area. While electrodes can be removed from the bending area, this causes a difference in the patterns in the device and reflected light can make internal patterns in the device visible to a user.

Display devices constructed according to the principles of the invention provide more robust, bendable displays without making the absence of removed internal electrodes or other components readily visible as patterns in reflected light. For example, inventive display devices include a dummy pattern, which is in or overlapped with a bending area, to reduce or eliminate defects, such as deterioration in sensitivity, and failures of sensors located in the vicinity of flex lines in the display and make it difficult for a user to recognize patterns in the reflections of external light from the sensors.

Additional aspects will be set forth in the detailed description which follows, and, in part, will be apparent from the disclosure, or may be learned by practice of the inventive concepts.

According to one aspect of the invention, a display device includes a display panel including a first area, a second area spaced from the first area, and a bending area disposed between the first and second areas, a first sensing pattern overlapped with the first area, a second sensing pattern spaced apart from the first sensing pattern and overlapped with the second area, and a first non-functional pattern overlapped with the bending area and spaced apart from each of the first and second sensing patterns to reduce visibility of internal structures in the display device in reflected light.

The bending area may be configured to be bendable around at least one bending axis, the first and second areas may be substantially inflexible, and the first non-functional pattern may be electrically disconnected from each of the first and second sensing patterns.

The first non-functional pattern may include a plurality of first dummy patterns.

The first dummy patterns may be arranged in an irregular manner.

The first sensing pattern, the second sensing pattern, and the first non-functional pattern may be disposed in the same layer.

The display device may further include a third sensing pattern overlapped with the first area and a fourth sensing pattern spaced apart from the third sensing pattern and overlapped with the second area. The third and fourth sensing patterns may be disposed in the same layer.

The display device may further include a second non-functional pattern, which is overlapped with the bending area and is spaced apart from each of the third and fourth sensing patterns to reduce visibility of internal structures in the display device in reflected light. The second non-functional pattern, the third pattern, and the fourth pattern may be disposed in the same layer.

The second non-functional pattern may be disposed over the first non-functional pattern.

The first and second sensing patterns may be configured to sense a position of an external touch, and the third and fourth sensing patterns may be configured to sense pressure of the external touch.

The first non-functional pattern may include substantially the same material as the first and second sensing patterns.

According to another aspect of the invention, a display device may include a display panel including a first area, a second area spaced from the first area, and a bending area disposed between the first and second areas, a first sensing pattern overlapped with the first area, a second sensing pattern spaced apart from the first sensing pattern and overlapped with the second area, a first non-functional pattern overlapped with the bending area and spaced apart from each of the first and second sensing patterns to reduce the visibility of internal structures in the display device in reflected light, and a pressure sensing pattern overlapped with the display panel.

The first and second sensing patterns may be configured to sense a position of an external touch, and the pressure sensing pattern may be configured to sense pressure of the external touch.

The bending area may be configured to be bendable about at least one bending axis, and the first and second areas may be configured to be substantially inflexible.

The first non-functional pattern may include a plurality of first dummy patterns arranged in an irregular manner.

The first sensing pattern, the second sensing pattern, and the first non-functional pattern may be disposed in the same layer.

The pressure sensing pattern may include a third sensing pattern overlapped with the first area, a fourth sensing pattern spaced apart from the third sensing pattern and overlapped with the second area, and a second non-functional pattern overlapped with the bending area and spaced apart from each of the third and fourth sensing patterns to reduce the visibility of internal structures in the display device in reflected light.

The third and fourth sensing patterns may be configured to sense pressure of an external touch.

The second non-functional pattern may include a plurality of second dummy patterns.

The second dummy patterns may be arranged in an irregular manner.

The second non-functional pattern, the third sensing pattern, and the fourth sensing pattern may be disposed in the same layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

Figure 1:
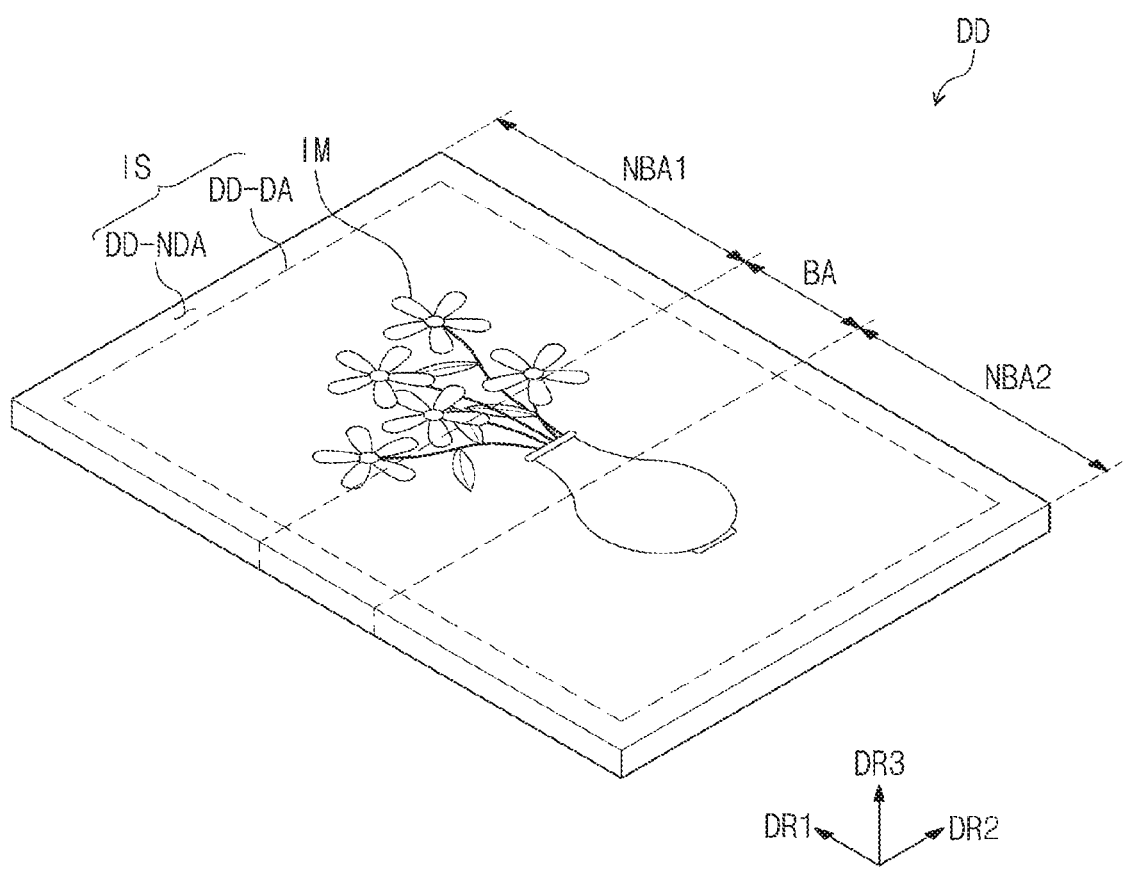
FIG. 1 is a perspective view of a display device constructed according to the principles of the invention in a first operation mode.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As shown in FIG. 1, in a first operation mode, a display surface IS, which is used to display an image IM, may be parallel to a plane defined by a first direction axis DR1 and a second direction axis DR2. Hereinafter, a direction normal to the display surface IS or a thickness direction of the display device DD will be referred to as a third direction axis DR3. A front or top surface and a rear or bottom surface of each member may be defined, based on the third direction axis DR3. However, directions indicated by the first to third direction axes DR1, DR2, and DR3 are relative and may be changed to indicate other directions. Hereinafter, first to third directions may be directions indicated by the first to third direction axes DR1, DR2, and DR3, respectively, and will be referenced with the same numerals.

Figure 2A:
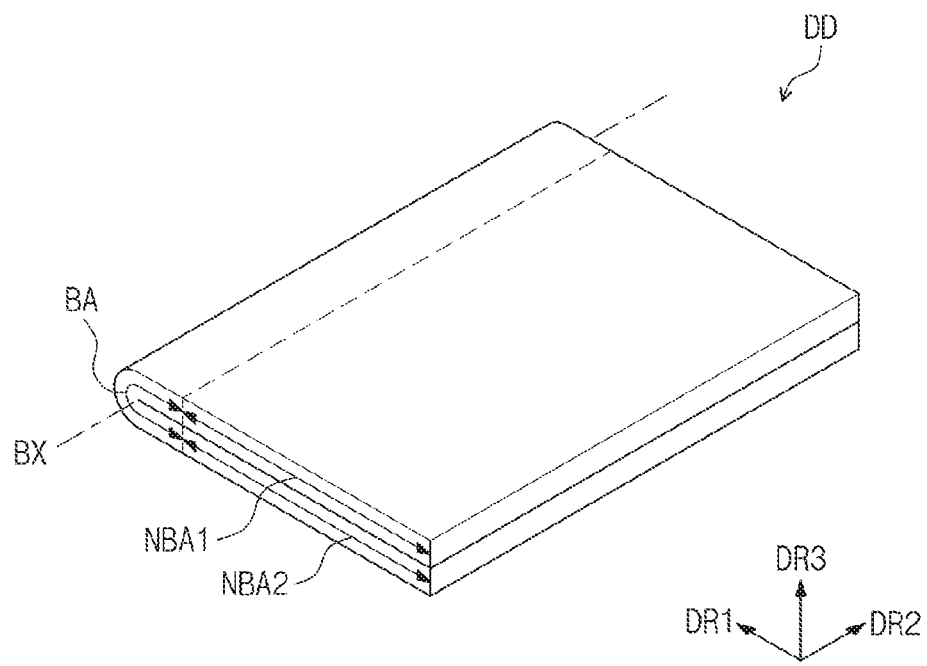
FIG. 2A is a perspective view of a display device constructed according to the principles of the invention in a second operation mode.
Figure 2B:
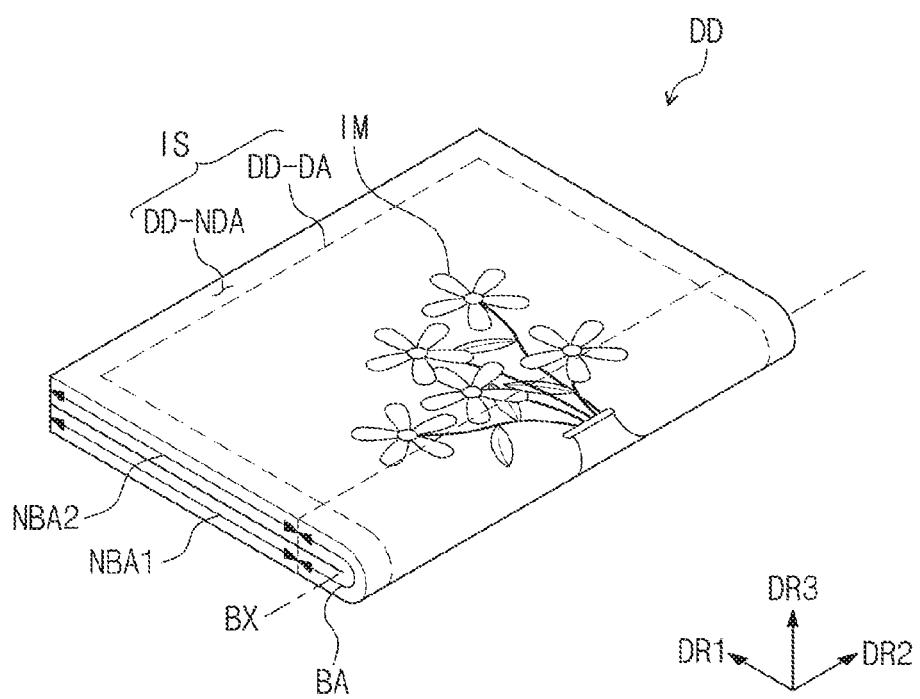
FIG. 2B is a perspective view of a display device constructed according to the principles of the invention in a third operation mode.

FIGS. 1, 2A, and 2B illustrate a foldable display device, which is an example of the flexible display device DD. However, the display device DD may be one of a rollable display device or a bended display device, or any other sort of display device. Furthermore, the flexible display device may take other forms than those shown and described in detail herein. For example, the display device DD may be a flat rigid display device. The flexible display device DD may be used for large-sized electronic devices such as television sets and monitors or small or medium-sized electronic devices such as mobile phones, tablets, car navigation systems, game machines, and smart watches.

As shown in FIG. 1, the display surface IS of the flexible display device DD may include a plurality of areas. The flexible display device DD may include a display area DD-DA, which is used to display the image IM, and a non-display area DD-NDA, which is adjacent to the display area DD-DA. The non-display area DD-NDA may be a region through which an image is not displayed. In FIG. 1, a vase and a bouquet of flowers therein are illustrated as an example of the image IM. As an example, the display area DD-DA may have a rectangular shape. The non-display area DD-NDA may be provided to surround the display area DD-DA or in some other orientation. Shapes of the display and non-display areas DD-DA and DD-NDA may be different from the examples depicted and described herein.

As shown in FIGS. 1, 2A, and 2B, the display device DD may include a plurality of areas, which are defined based on its operation mode. The display device DD may include a bending area BA that can be bent around a bending axis BX. The bending area BA may be configured to be bendable around at least one of a plurality of bending axes. The display device DD may further include a first area NBA1 and a second area NBA2, which are non-bendable. The bending area BA may be provided between the first and second areas NBA1 and NBA2. Each of the first and second areas NBA1 and NBA2 may have a generally flat shape.

As shown in FIG. 2A, the display device DD may be configured to bent inwardly, which makes it possible for the display surface IS of the first area NBA1 to face the display surface IS of the second area NBA2. As shown in FIG. 2B, the display device DD may also be configured to be bent outerwardly, which makes it possible for the display surface IS to be exposed to the outside.

The display device DD may include a plurality of the bending areas BA. Furthermore, the bending area BA may be defined, based on a shape of the display device DD manipulated by a user. For example, unlike that shown in FIGS. 2A and 2B, the bending area BA may be parallel to the first direction axis DR1 or in a diagonal direction. An area of the bending area BA might not be fixed and may be dependent on, for example, its radius of curvature. The display device DD may be configured to allow only the bending operation modes illustrated in FIGS. 1 and 2A or any other modes.

Figure 3:
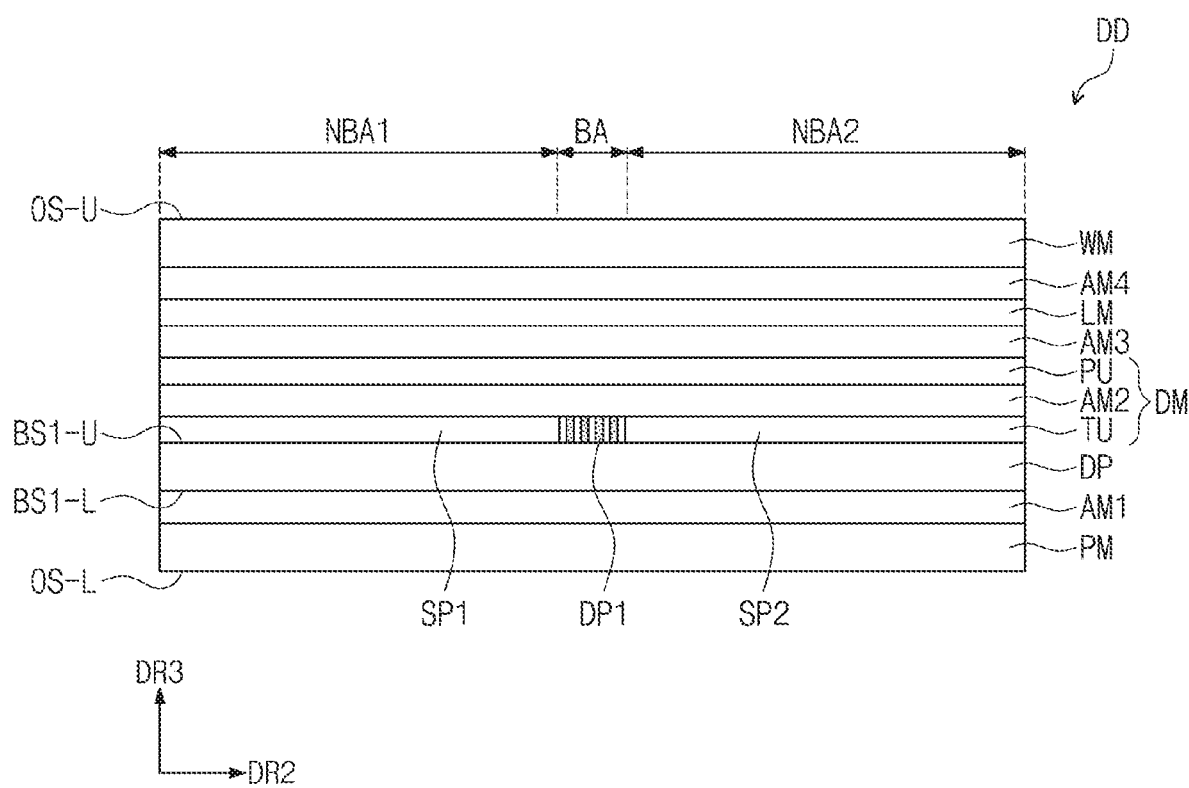
FIG. 3 is a sectional view of a first embodiment of a display device constructed according to the principles of the invention, including a first embodiment of a display module.

As shown in FIG. 3, the display device DD may include a protection film PM, a display module DM, an optical member LM, a window WM, a first adhesive member AM1, a third adhesive member AM3, and a fourth adhesive member AM4. The display module DM may be provided between the protection film PM and the optical member LM. The optical member LM may be provided between the display module DM and the window WM. The first adhesive member AM1 may be configured to couple the display module DM to the protection film PM, the third adhesive member AM3 may be configured to couple the display module DM to the optical member LM, and the fourth adhesive member AM4 may be configured to couple the optical member LM to the window WM.

The protection film PM may be configured to protect the display module DM. The protection film PM may have a first outer surface OS-L, which is exposed to the outside, and an attachment surface, which is attached to the first adhesive member AM1. The protection film PM may be configured to prevent outer moisture from infiltrating the display module DM and to absorb shock from the outside.

The protection film PM may include a plastic film, which is used as a base substrate thereof. The protection film PM may include a plastic film containing one or more materials selected from the group consisting of polyethersulfone (PES), polyacrylate, polyetherimide (PEI), polyethylenenaphthalate (PEN), polyethyleneterephthalate (PET), polyphenylene sulfide (PPS), polyacrylate, polyimide (PI), polycarbonate (PC), poly(arylene ethersulfone).

Materials for the protection film PM are not limited to plastic resins. For example, organic/inorganic composites may be used for the protection film PM. The protection film PM may include a porous organic layer and an inorganic material, which is formed in pores of the organic layer. The protection film PM may further include a functional layer formed on the plastic film. The functional layer may include a resin layer. The functional layer may be formed by a coating method. Alternatively, the protection film PM may be omitted.

The window WM may include a plastic film. The window WM may have a multi-layered structure. For example, the window WM may have a multi-layered structure including at least one of a glass substrate, a plastic film, and a plastic substrate. The window WM may further include a bezel pattern. The multi-layered structure may be formed by successively performing a series of process steps or by repeating an attachment process using an adhesive layer.

The optical member LM may be configured to reduce optical reflectance of light incident from the outside. The optical member LM may include at least one polarization film. The optical member LM may further include a phase difference film. Alternatively, the optical member LM may be omitted.

The display module DM may include an organic light emitting display panel DP, a position sensing unit TU, a pressure sensing unit PU, and a second adhesive member AM2, which is used to attach the position and pressure sensing units TU and PU to each other. The organic light emitting display panel DP may be configured to include the first area NBA1, the second area NBA2, and the bending area BA. The position sensing unit TU may be directly placed on the organic light emitting display panel DP. Herein, the expression "be directly placed" means that two layers are successively formed one on top of the other, without a step for forming an additional adhesive layer therebetween.

As an example, the pressure sensing unit PU may be directly placed on the position sensing unit TU.

If an image data is input to the organic light emitting display panel DP, the organic light emitting display panel DP may display an image (e.g., see IM of FIG. 1) based on the image data. The organic light emitting display panel DP may have a first display panel surface BS1-L and a second display panel surface BS1-U, which face each other in the thickness direction DR3. Although the organic light emitting display panel DP is described herein for illustrative purposes, the display panel may take a different forms known in the art as well.

The position sensing unit TU may include a first sensing pattern SP1, a second sensing pattern SP2, and a first dummy pattern DP1 provided between the first and second sensing patterns SP1 and SP2. As used herein, the term "dummy pattern" means a pattern formed in a semi-conductor process for making an electronic device that does not have an electrical function in the device.

The first and second sensing patterns SP1 and SP2 may be spaced apart from each other in the second direction DR2. The first and second sensing patterns SP1 and SP2 may be electrically disconnected from each other.

The first sensing pattern SP1 may be overlapped with the first area NBA1. The second sensing pattern SP2 may be overlapped with the second area NBA2. The first dummy pattern DP1 may be overlapped with the bending area BA.

The first sensing pattern SP1, the second sensing pattern SP2, and the first dummy pattern DP1 may be formed on or in the same layer or at the same level.

A plurality of first dummy patterns DP1 may be provided. Although four first dummy patterns DP1 are illustrated in the sectional view of FIG. 3, the number of dummy patterns DP1 may vary.

The first and second sensing patterns SP1 and SP2 may be configured to obtain information regarding a position of a touch event to be input from the outside. For example, the first and second sensing patterns SP1 and SP2 may be configured to sense an external input by electrostatic capacitance.

The first dummy pattern DP1 may be formed of, or include, the same material as the first and second sensing patterns SP1 and SP2. The first dummy pattern DP1 may be electrically disconnected from at least some or each of the first and second sensing patterns SP1 and SP2. The first sensing pattern SP1, the second sensing pattern SP2, and the first dummy pattern DP1 will be described in more detail below.

The pressure sensing unit PU may be placed on the position sensing unit TU, or some other component or, the position sensing unit TU may be placed on the pressure sensing unit PU.

The pressure sensing unit PU may be configured to sense pressure of a touch event to be input from the outside and to obtain information regarding the pressure. For example, the pressure sensing unit PU may include a sensing pattern, which is used to sense pressure of a touch event to be input from the outside. If a touch event from the outside occurs, the sensing pattern may be deformed to cause a change in terminal resistance of the sensing pattern, and the pressure information may be obtained based on such a change in terminal resistance of the sensing pattern.

The display module DM may further include an anti-reflection layer. The anti-reflection layer may include a color filter or a stack of a conductive layer, an insulating layer, and another conductive layer. The anti-reflection layer may be configured to absorb light incident from the outside or to reduce optical reflectance of the light through destructive interference or polarization of the light. The anti-reflection layer may be used to replace the role of the optical member LM.

At least some or each of the first to fourth adhesive members AM1 to AM4 may be formed of, or include, an optically clear adhesive (OCA) film or an organic adhesive layer such as an optically clear resin (OCR) or a pressure sensitive adhesive (PSA) film. The organic adhesive layer may include adhesive materials such as polyurethanes, polyacrylic, polyester, polyepoxy, and polyvinyl acetate materials. That is, the organic adhesive layer may be one of the organic layers mentioned herein.

Although not shown, the display device DD may further include a frame structure, which is used to support functional layers for maintaining the operation modes or shapes illustrated in FIGS. 1, 2A, and 2B. The frame structure may include a joint structure or a hinge structure.

Figure 4A:
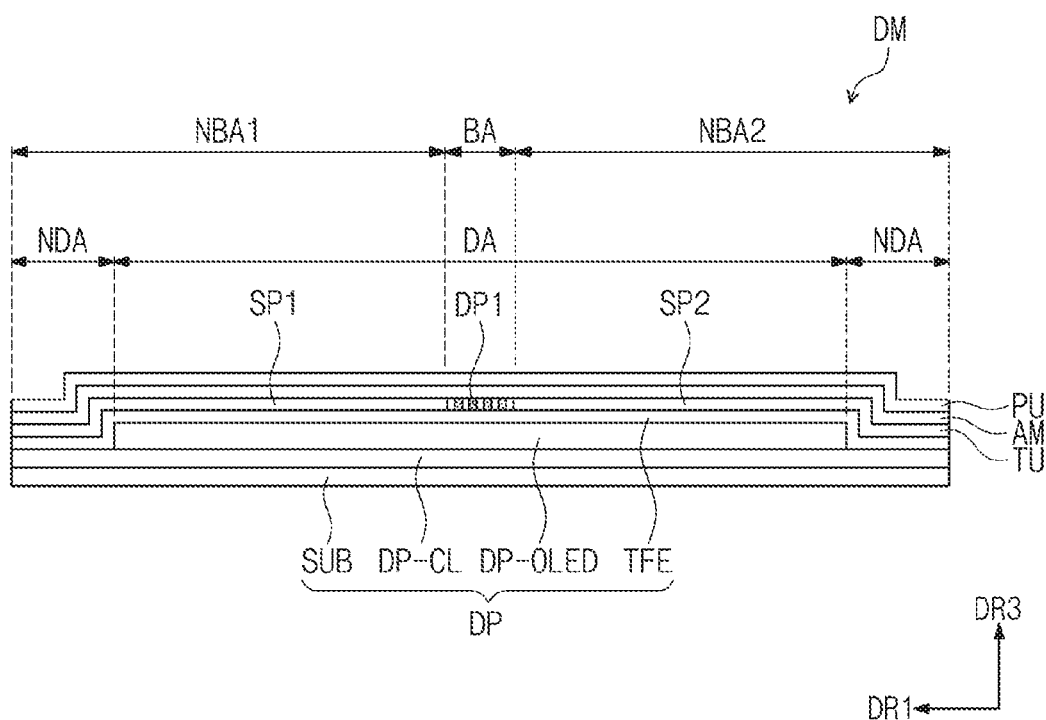
FIG. 4A is a sectional view of a second embodiment of a display module constructed according to the principles of the invention.

As shown in FIG. 4A, the organic light emitting display panel DP may include a base layer SUB and a circuit layer DP-CL, a device layer DP-OLED, and a thin-film encapsulation layer TFE, which are provided on the base layer SUB. The base layer SUB may include at least one plastic film. The base layer SUB may be a flexible substrate and may include a plastic substrate, a glass substrate, a metal substrate, or a substrate made of organic and/or inorganic composites.

The circuit layer DP-CL may include a plurality of insulating layers, a plurality of conductive layers, and one or more semiconductor layers. In the circuit layer DP-CL, the plurality of conductive layers may be used as signal lines or for control circuits of pixels. The device layer DP-OLED may include organic light emitting diodes. The thin-film encapsulation layer TFE may include at least one inorganic layer and at least one organic layer. The inorganic layer may protect the device layer DP-OLED from moisture or oxygen, and the organic layer may protect the device layer DP-OLED from foreign substances such as dust particles, for example. The inorganic layer may be formed of, or include, one or more of silicon nitride, silicon oxynitride, and/or silicon oxide. The organic layer may be formed of or include one or more of acrylic-based organic materials, and/or other materials known in the art.

The position sensing unit TU may be directly placed on the thin-film encapsulation layer, and the pressure sensing unit PU may be placed on the position sensing unit TU. The position sensing unit TU and the pressure sensing unit PU may include sensing patterns, as described above. The sensing patterns may have a single or multi-layered structure.

The sensing patterns may be formed of, or include, one or more of indium tin oxide (ITO), indium zinc oxide (IZO), zinc oxide (ZnO), indium tin zinc oxide (ITZO), PEDOT, metal nano wire, and/or graphene. The sensing patterns may include a metal layer formed of molybdenum, silver, titanium, copper, aluminum, or alloys thereof.

The description of the remaining elements of FIG. 4A may be substantially the same as the description of those features above in connection with FIG. 3, and thus, redundant descriptions thereof will be omitted here for the sake of brevity.

Figure 4B:
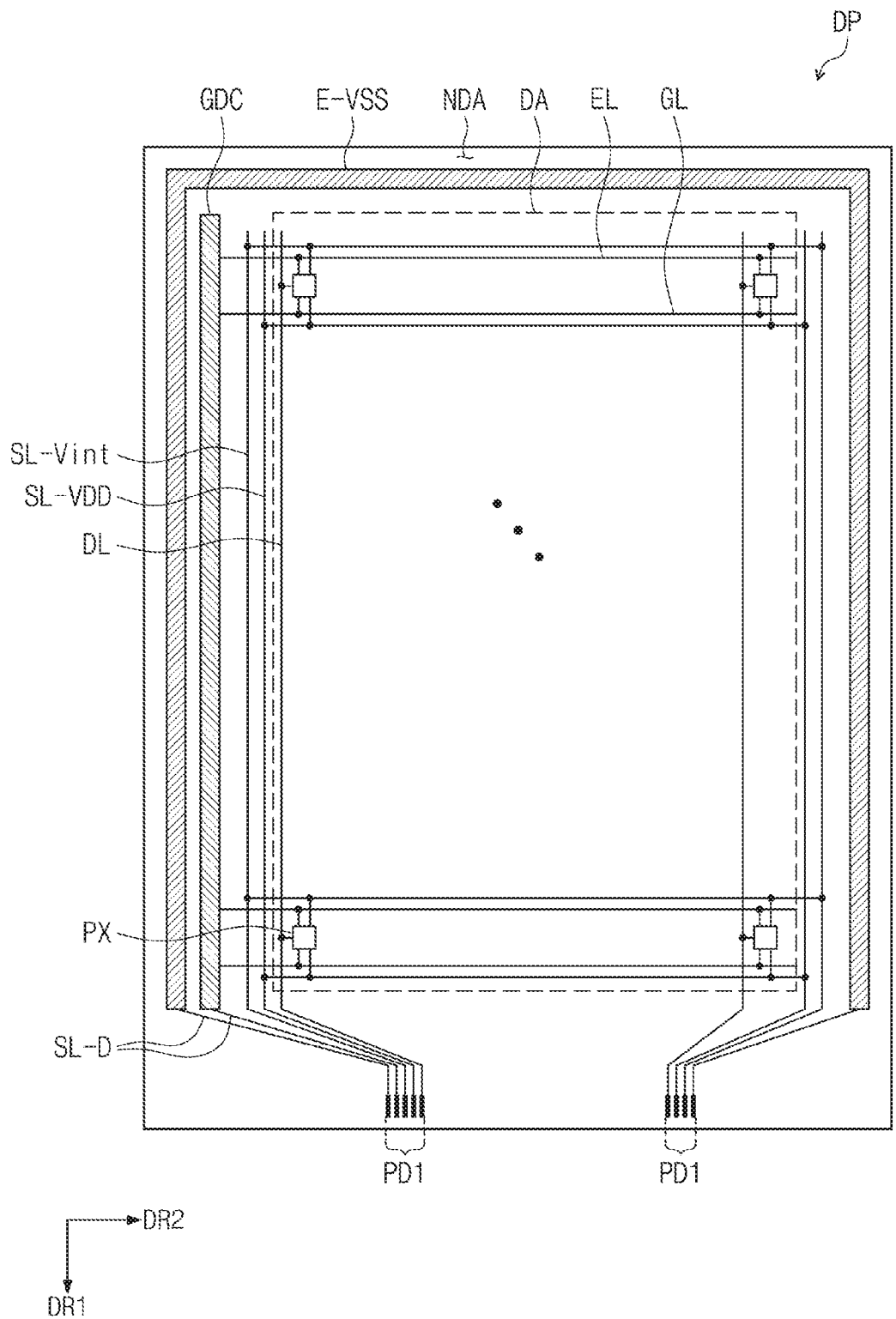
FIG. 4B is a schematic plan view of an organic light emitting display panel for use in a display device constructed according to the principles of the invention.

As shown in FIG. 4B, the organic light emitting display panel DP may include a display area DA and a non-display area NDA, when viewed in a plan view. The display and non-display areas DA and NDA of the organic light emitting display panel DP may correspond to the display and non-display areas DD-DA and DD-NDA, respectively, of the display device DD described herein with reference to FIG. 1. The display and non-display areas DA and NDA of the organic light emitting display panel DP may be configured to be the same as, or different from, the display and non-display areas DD-DA and DD-NDA, respectively, of the display device DD of FIG. 1. For example, depending on the structure or design of the organic light emitting display panel DP, or other considerations, the display and non-display areas DA and NDA may be changed from the display and non-display areas DD-DA and DD-NDA of FIG. 1.

The organic light emitting display panel DP may include a plurality of pixels PX. A region, on which the plurality of pixels PX is provided, may be defined as the display area DA. The non-display area NDA may be provided along a border of the display area DA.

The organic light emitting display panel DP may include gate lines GL, data lines DL, light-emitting lines EL, one or more control signal lines SL-D, one or more initializing voltage lines SL-Vint, one or more voltage line SL-VDD, one or more first pad PD1, and one or more power supply lines E-VSS.

The gate lines GL may be connected to respective ones of the pixels PX, and the data lines DL may be connected to respective ones of the pixels PX. At least some or each of the light-emitting lines EL may be arranged to be parallel to a corresponding one of the gate lines GL. The control signal line SL-D may be used to provide control signals to a gate driving circuit GDC. The initializing voltage line SL-Vint may be used to provide an initializing voltage to the pixels PX. The voltage line SL-VDD may be connected to the plurality of pixels PX to supply a first voltage to the pixels PX. The voltage line SL-VDD may include a plurality of lines extending in the first direction DR1 and a plurality of lines extending in the second direction DR2. The power supply line E-VSS may be provided in the non-display area NDA to enclose three sides of the display area DA. The power supply line E-VSS may be used to supply a common voltage, such as a second voltage, to the pixels PX. The common voltage may be a voltage that is lower than the first voltage.

The gate driving circuit GDC, to which the gate lines GL and the light-emitting lines EL are connected, may be provided in one of edge regions of the non-display area NDA. Some of the gate lines GL, the data lines DL, the light-emitting lines EL, the control signal line SL-D, the initializing voltage line SL-Vint, and the voltage line SL-VDD may be placed on, or in, the same layer, and the others may be placed on, or in, another layer.

The first pad PD1 may be connected to end portions of the data lines DL, the control signal line SL-D, the initializing voltage line SL-Vint, and the voltage line SL-VDD.

Figure 4C:
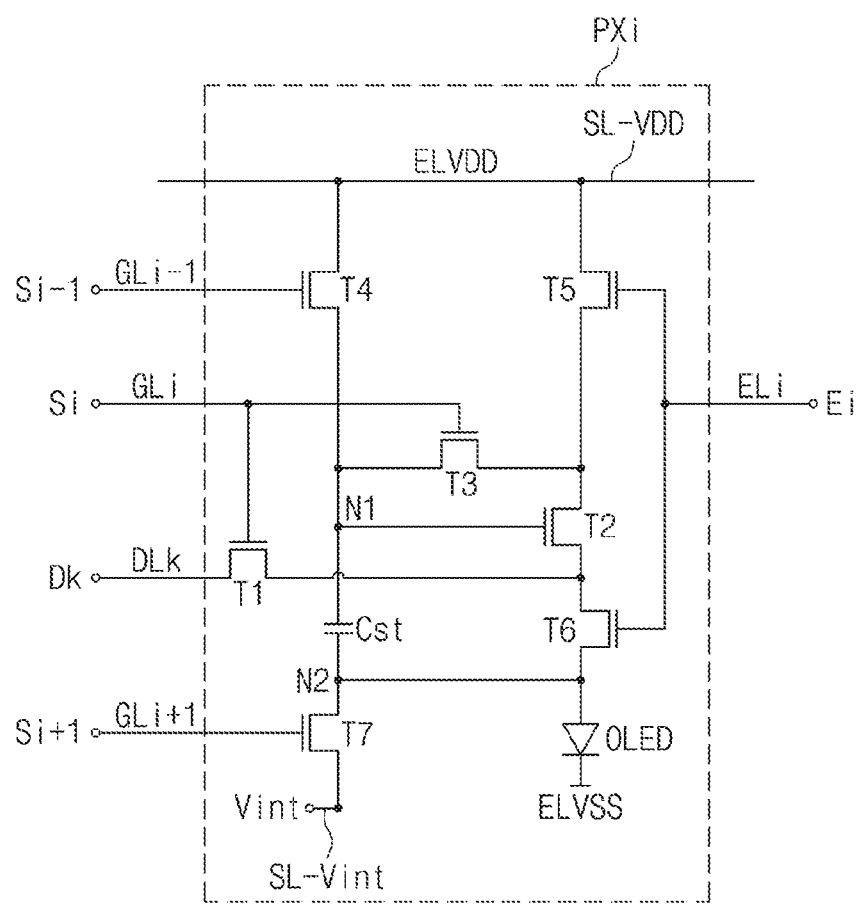
FIG. 4C is an equivalent circuit diagram of a pixel for use in a display device constructed according to the principles of the invention.

In FIG. 4C, an i-th pixel PXi is illustrated as an example of the pixels PX. As shown in FIG. 4C, the i-th pixel PXi may be connected to a k-th data line DLk, which is one of the data lines DL of FIG. 4B.

The i-th pixel PXi may include an organic light emitting diode OLED and a pixel driving circuit, which is used to control the organic light emitting diode OLED. The driving circuit may include seven thin-film transistors T1-T7 and one storage capacitor Cst.

The driving circuit may be configured to control a driving current to be supplied to the organic light emitting diode OLED. An output electrode of the second transistor T2 may be electrically connected to the organic light emitting diode OLED. The output electrode of the second transistor T2 may be in direct contact with an anode of the organic light emitting diode OLED or may be connected to the anode via other transistor such as, for example, the sixth transistor T6.

A control transistor may be configured to receive a control signal thorough a control electrode thereof. The control signal applied to the i-th pixel PXi may include an (i−1)-th gate signal Si−1, an i-th gate signal (Si), an (i+1)-th gate signal Si+1, a data signal Dk, and an i-th light-emitting control signal Ei. The control transistor may include the first and third to seventh transistors T1 and T3-T7.

The first transistor T1 may include an input electrode coupled to the k-th data line DLk, a control electrode coupled to the i-th gate line GLi, and an output electrode coupled to the output electrode of the second transistor T2. The first transistor T1 may be turned-on by a gate signal Si (hereinafter, an i-th gate signal) applied to the i-th gate line GLi to provide a data signal Dk (which is applied to the k-th data line DLk) to the storage capacitor Cst.

Figure 5:
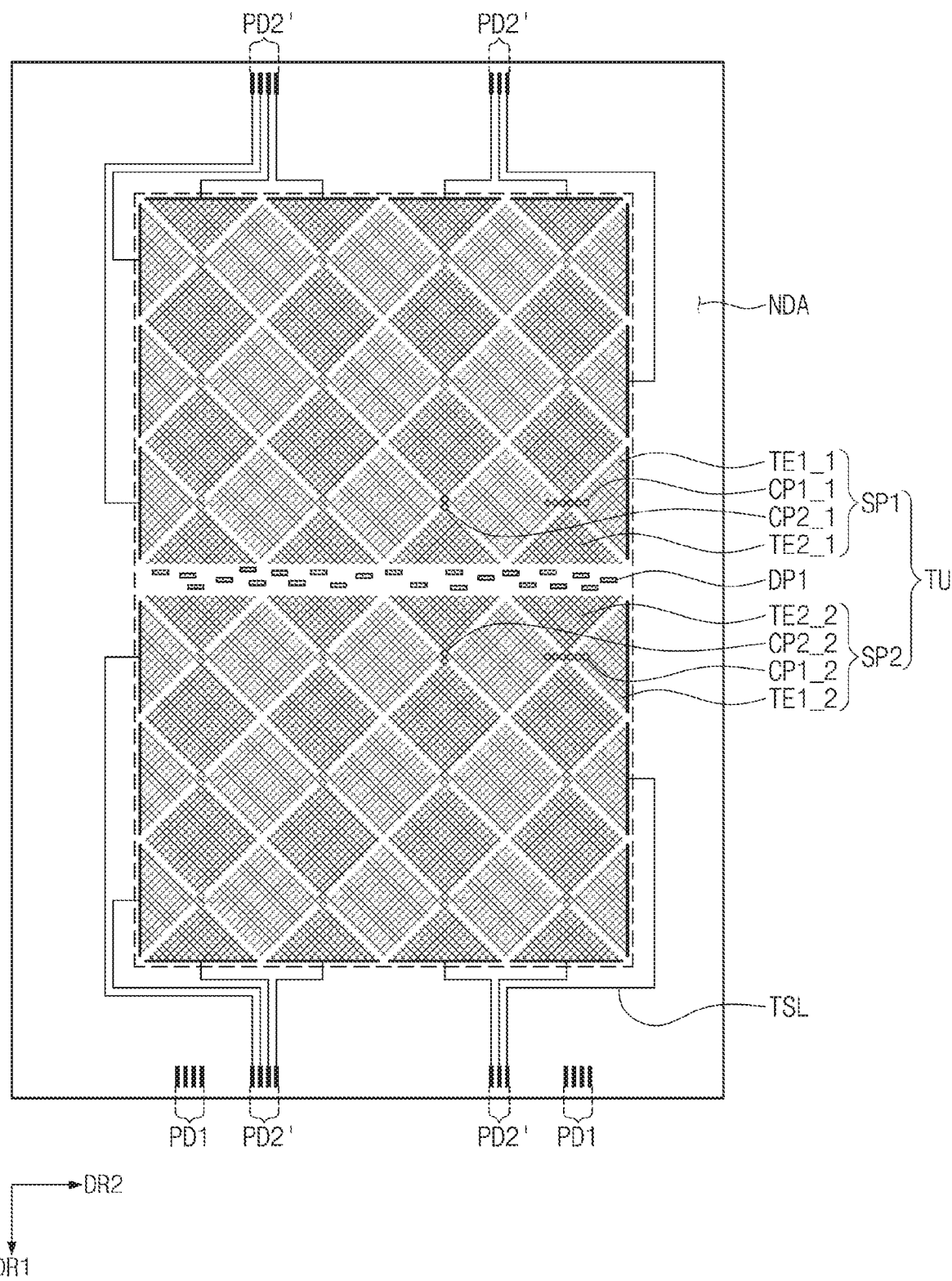
FIG. 5 is a schematic plan view of a first embodiment of a position sensing unit for use in a display device constructed according to the principles of the invention.

As shown in FIG. 5, the first sensing pattern SP1 of the exemplary position sensing unit TU may include (1-1)-th touch electrodes TE1_1, which extend in the second direction DR2 and are arranged in the first direction DR1, (2-1)-th touch electrodes TE2_1, which extend in the first direction DR1 and are arranged across the second direction DR2, (1-1)-th connection electrodes CP1_1, at least some or each of which are used to connect pairs of the (1-1)-th touch electrodes TE1_1 adjacent to each other in the second direction DR2, and (2-1)-th connection electrodes CP2_1, at least some or each of which are used to connect pairs of the (2-1)-th touch electrodes TE2_1 adjacent to each other in the first direction DR1. The numbers of the (1-1)-th touch electrodes TE1_1, the (2-1)-th touch electrodes TE2_1, the (1-1)-th connection electrodes CP1_1, and the (2-1)-th connection electrodes CP2_1 may be changed from the numbers of those elements shown in FIG. 5.

At least some or each of the (1-1)-th touch electrodes TE1_1, the (2-1)-th touch electrodes TE2_1, the (1-1)-th connection electrodes CP1_1, and the (2-1)-th connection electrodes CP2_1 may have a mesh shape, in which a plurality of touch openings are defined.

The (1-1)-th connection electrodes CP1_1 and the (2-1)-th connection electrodes CP2_1 may be arranged to cross each other and may be electrically disconnected from each other.

The (1-1)-th touch electrodes TE1_1 and the (2-1)-th touch electrodes TE2_1 may be electrostatically coupled to each other. For example, electric capacitance between at least some or each pair of the (1-1)-th and (2-1)-th touch electrodes TE1_1 and TE2_1 may be changed, when a touch event from the outside is applied thereto.

The second sensing pattern SP2 may include (1-2)-th touch electrodes TE1_2, which extend in the second direction DR2 and are arranged in the first direction DR1, (2-2)-th touch electrodes TE2_2, which extend in the first direction DR1 and are arranged in the second direction DR2, (1-2)-th connection electrodes CP1_2, at least some or each of which are used to connect pairs of the (1-2)-th touch electrodes TE1_2 adjacent to each other in the second direction DR2, and (2-2)-th connection electrodes CP2_2, at least some or each of which are used to connect pairs of the (2-2)-th touch electrodes TE2_2 adjacent to each other in the first direction DR1. The numbers of the (1-2)-th touch electrodes TE1_2, the (2-2)-th touch electrodes TE2_2, the (1-2)-th connection electrodes CP1_2, and the (2-2)-th connection electrodes CP2_2 may be changed from the numbers of those elements shown in FIG. 5.

At least some or each of the (1-2)-th touch electrodes TE1_2, the (2-2)-th touch electrodes TE2_2, the (1-2)-th connection electrodes CP1_2, and the (2-2)-th connection electrodes CP2_2 may have a mesh shape, in which a plurality of touch openings are defined.

The (1-2)-th connection electrodes CP1_2 and the (2-2)-th connection electrodes CP2_2 may be arranged to cross each other and may be electrically disconnected from each other.

The (1-2)-th touch electrodes TE1_2 and the (2-2)-th touch electrodes TE2_2 may be electrostatically coupled to each other. For example, electric capacitance between at least some or each pair of the (1-2)-th and (2-2)-th touch electrodes TE1_2 and TE2_2 may be changed, when a touch event from the outside is applied thereto.

A touch signal line TSL may be connected to the at least some or each of the outermost ones of the touch electrodes TE1_1, TE1_2, TE2_1, and TE2_2. The touch signal line TSL may be continuously extended from one of the touch electrodes TE1_1, TE1_2, TE2_1, and TE2_2 and may be overlapped with the non-display area NDA. The touch signal line TSL may be provided to connect at least some or each of the outermost ones of the touch electrodes TE1_1, TE1_2, TE2_1, and TE2_2 to a second pad PD2'. The second pad PD2' may be overlapped with the non-display area NDA.

The first and second sensing patterns SP1 and SP2 may be spaced apart from each other by a region overlapped with the bending area BA. For example, the first and second sensing patterns SP1 and SP2 might not be provided on the bending area BA, and this may make it possible to reduce or prevent deterioration in sensitivity of a sensing operation or to prevent an operational failure, which may occur when the display device DD is bent. This may be true regardless of whether the display device DD is inwardly or outwardly bent.

The first dummy pattern DP1 may be placed between the first and second sensing patterns SP1 and SP2. A plurality of the first dummy patterns DP1 may be arranged in a random or irregular manner, as shown in FIG. 5. For example, the first dummy patterns DP1 may be arranged in such a way that adjacent ones thereof are separated by at least two different distances. Although FIG. 5 illustrates an example in which each of the first dummy patterns DP1 has a rectangular shape in a plan view. However, the shape of the first dummy patterns DP1 is not limited to this example and may be altered.

The first dummy pattern DP1 may be formed of, or include, one or more of indium tin oxide (ITO), indium zinc oxide (IZO), zinc oxide (ZnO), indium tin zinc oxide (ITZO), PEDOT, metal nano wire, or graphene, similar to the first and second sensing patterns SP1 and SP2, and the first dummy pattern DP1 may include a metal layer formed of molybdenum, silver, titanium, copper, aluminum, or alloys thereof.

Since the first and second sensing patterns SP1 and SP2 are spaced apart from each other, there may be a difference in optical reflectance between the bending area BA and the first to second areas BA1 and BA2. However, by including the first dummy pattern DP1, it may become harder for an external user to recognize patterns in the external light reflected by the sensors, which may otherwise be caused due to the difference in optical reflectance between the bending area BA and the first to second areas NBA1 and NBA2.

Figure 6:
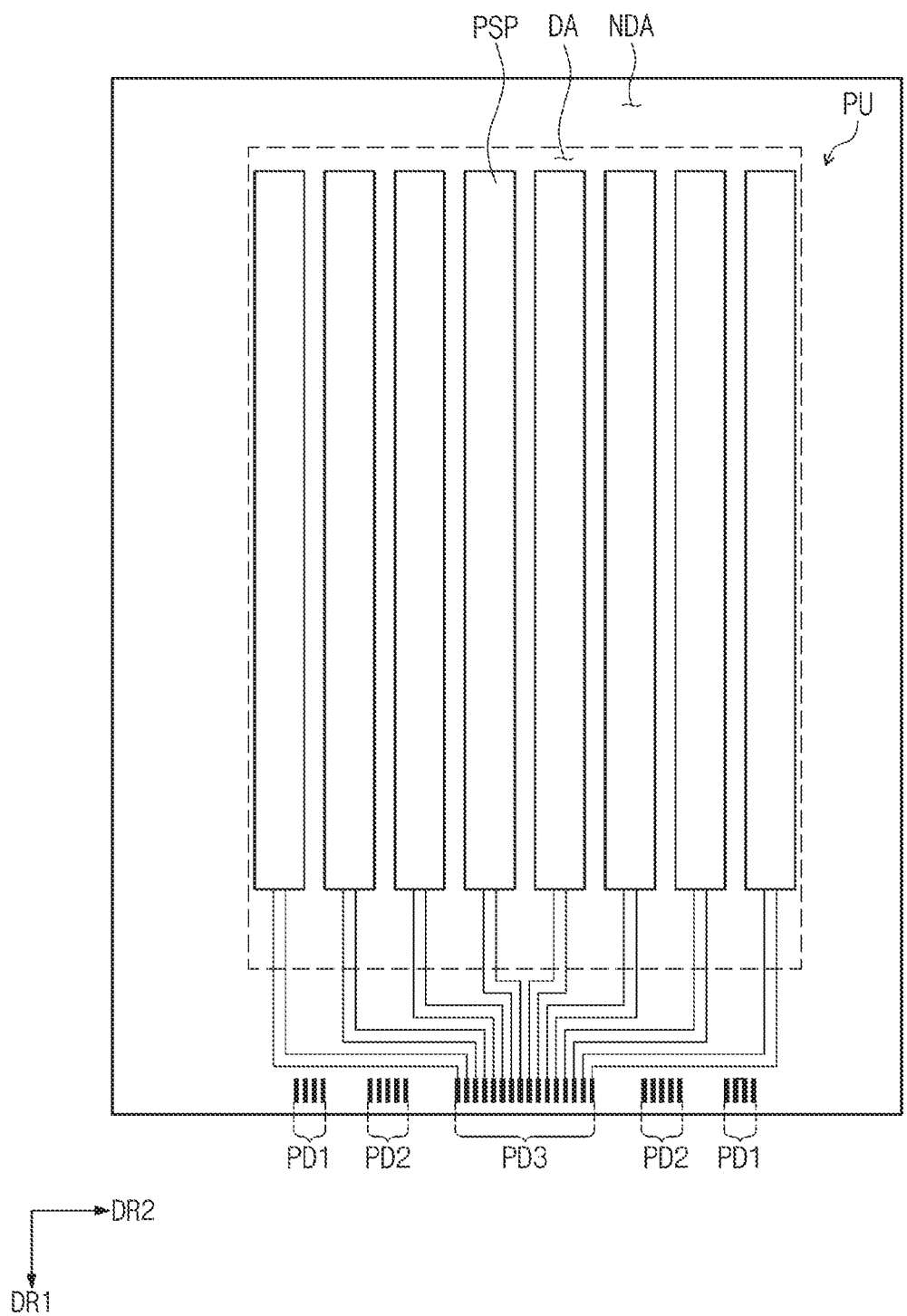
FIG. 6 is a schematic plan view of a first embodiment of a pressure sensing unit for use in a display device constructed according to the principles of the invention.

Referring to FIGS. 3 and 6, the pressure sensing unit PU may include a pressure sensing pattern PSP.

A plurality of the pressure sensing patterns PSP may be provided. Although, in FIG. 6, the pressure sensing pattern PSP is illustrated having a rectangular shape in a plan view, the shape of the pressure sensing pattern PSP is not limited to this example and may be altered. The pressure sensing pattern PSP may extend substantially throughout and over the entire display area DA.

A voltage input line SIL and a voltage sensing line SSL may extend from the pressure sensing pattern PSP. The voltage input line SIL and the voltage sensing line SSL may overlap the non-display area NDA and may be used to electrically connect the pressure sensing pattern PSP to a third pad PD3. The third pad PD3 may overlap the non-display area NDA.

The voltage input line SIL may be used to apply a voltage, which is generated by a voltage input circuit, to the pressure sensing pattern PSP.

When there is a touch event from the outside, the pressure sensing pattern PSP may be deformed to cause a change in voltage level of the voltage. The changed voltage may be applied to a voltage sensing circuit through the voltage sensing line SSL.

Figure 7:
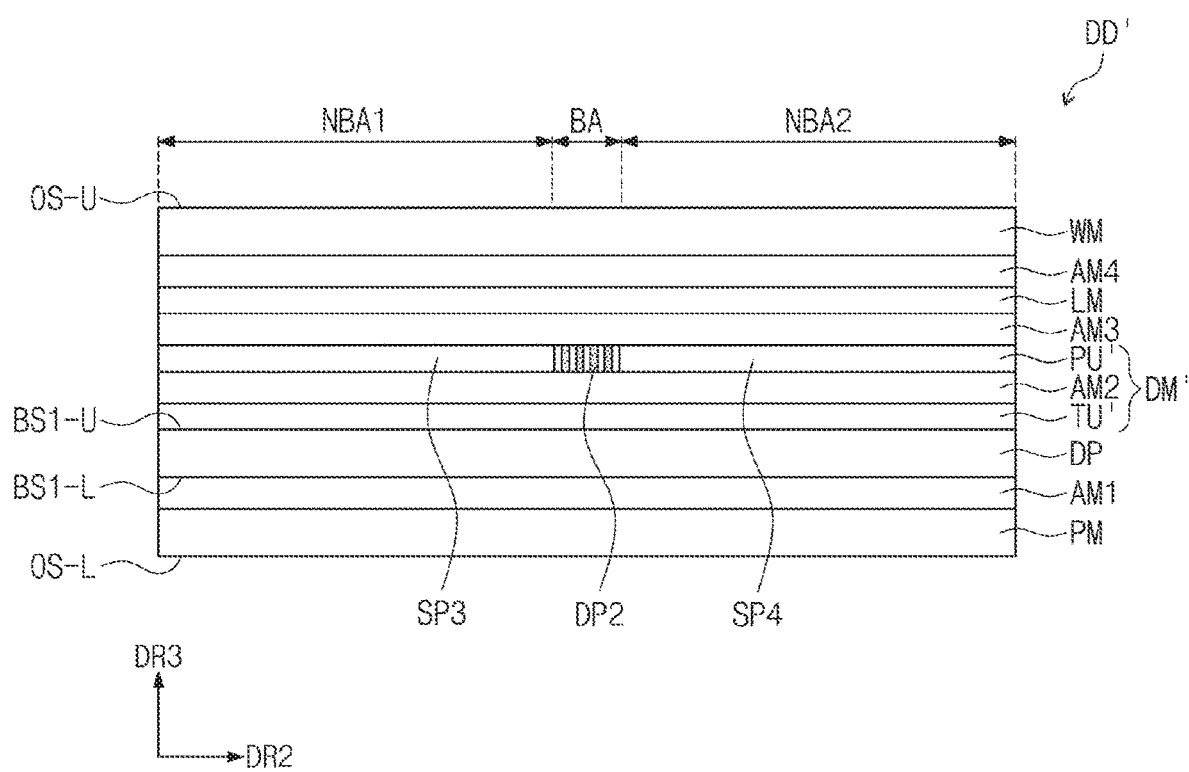
FIG. 7 is a sectional view of a second embodiment of a display device constructed according to the principles of the invention, including a third embodiment of a display module.

As shown in FIG. 7, the embodiment of a display device DD' may include a display module DM', in which a position sensing unit TU' and a pressure sensing unit PU' are provided.

The position sensing unit TU' may be configured to obtain information regarding a position of a touch event from the outside. For example, the position sensing unit TU' may be configured to sense an external input by electrostatic capacitance.

The pressure sensing unit PU' may be placed on the position sensing unit TU' or another component.

The pressure sensing unit PU may include a third sensing pattern SP3, a fourth sensing pattern SP4, and a second dummy pattern DP2, which is provided between the third and fourth sensing patterns SP3 and SP4.

The third sensing pattern SP3 and the fourth sensing pattern SP4 may be spaced apart from each other in the second direction DR2. The third and fourth sensing patterns SP3 and SP4 may be electrically disconnected from each other.

The third sensing pattern SP3 may be overlapped with the first area NBA1. The fourth sensing pattern SP4 may be overlapped with the second area NBA2. The second dummy pattern DP2 may be overlapped with the bending area BA.

The third sensing pattern SP3, the fourth sensing pattern SP4, and the second dummy pattern DP2 may be placed on, or in, the same layer or at the same level.

A plurality of the second dummy patterns DP2 may be provided. Although four second dummy patterns DP2 are illustrated in the sectional view of FIG. 7, the number of second dummy patterns DP2 may vary.

The third and fourth sensing patterns SP3 and SP4 may be configured to sense pressure of a touch event from the outside and to obtain information on the pressure of the touch event. For example, if a touch event from the outside occurs, the third and fourth sensing patterns SP3 and SP4 may be deformed to cause a change in terminal resistance of each of the third and fourth sensing patterns SP3 and SP4, and the pressure information may be obtained based on this change in terminal resistance.

The second dummy pattern DP2 may be formed of, or include, the same material as the third and fourth sensing patterns SP3 and SP4. The second dummy pattern DP2 may be electrically disconnected from each of the third and fourth sensing patterns SP3 and SP4.

Except for the foregoing differences, the description of like elements of the display device DD' may be substantially the same as the descriptions thereof in connection with FIG. 3, and thus, redundant descriptions thereof will be omitted here for the sake of brevity.

Figure 8:
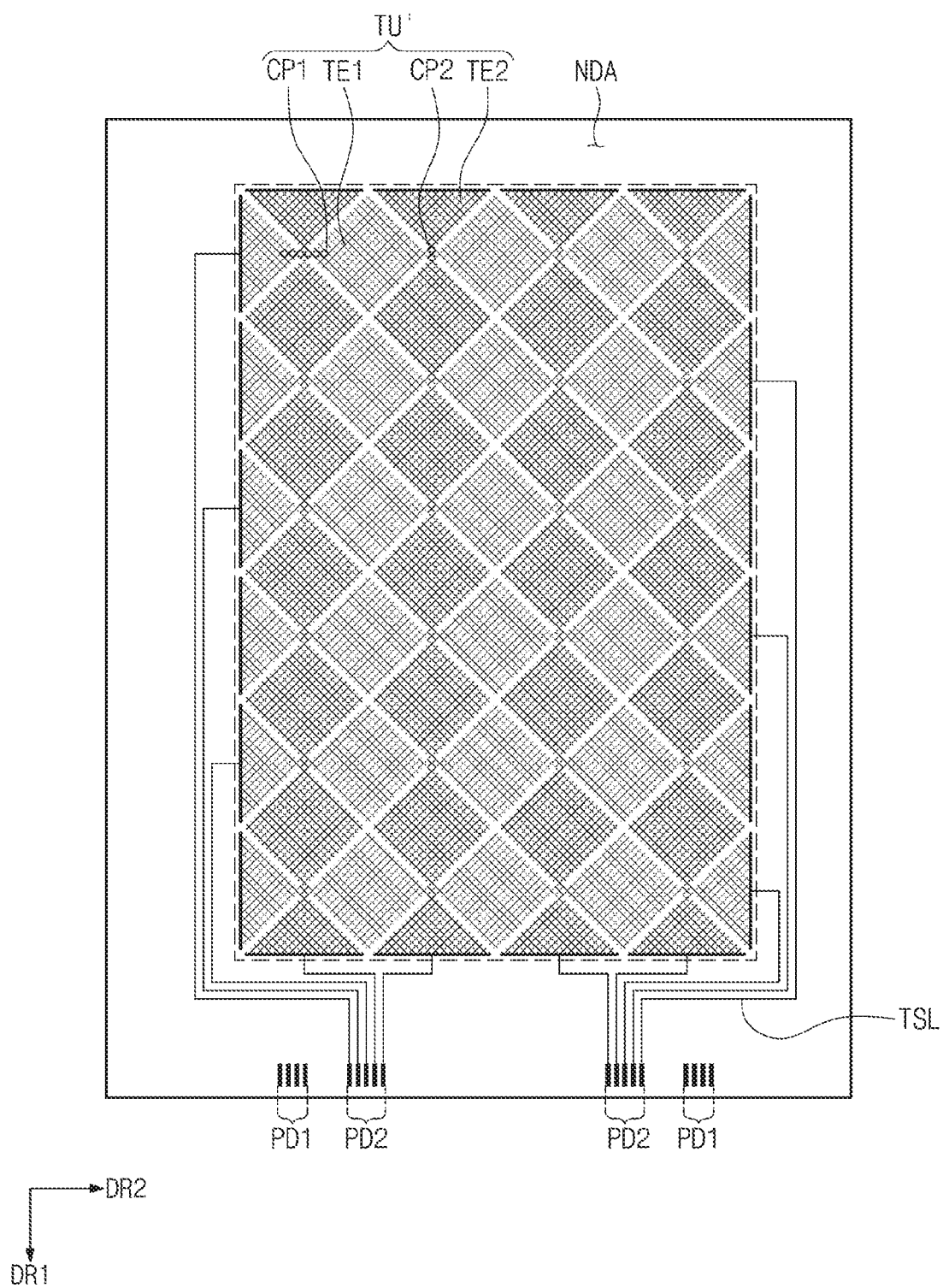
FIG. 8 is a schematic plan view of a second embodiment of a position sensing unit for use in a display device constructed according to the principles of the invention.

Referring to FIG. 8, the position sensing unit TU may include first touch electrodes TE1, which extend in the second direction DR2 and are arranged across the first direction DR1, second touch electrodes TE2, which extend in the first direction DR1 and are arranged across the second direction DR2, first connection electrodes CP1, at least some or each of which are used to connect pairs of the first touch electrodes TE1 adjacent to each other in the second direction DR2, and second connection electrodes CP2, at least some or each of which are used to connect pairs of the second touch electrodes TE2 adjacent to each other in the first direction DR1.

At least some or each of the first touch electrodes TE1, the second touch electrodes TE2, the first connection electrodes CP1, and the second connection electrodes CP2 may have a mesh shape, in which a plurality of touch openings are defined.

The first connection electrodes CP1 and the second connection electrodes CP2 may be arranged to cross each other and may be electrically disconnected from each other.

The first touch electrodes TE1 and the second touch electrodes TE2 may be electrostatically coupled to each other. For example, electric capacitance between at least some or each pair of the first and second touch electrodes TE1 and TE2 may be changed when a touch event from the outside is applied thereto.

The description of the remaining elements of FIG. 8 may be substantially the same as the description of like elements of FIG. 5, and thus, redundant descriptions thereof will be omitted here for the sake of brevity.

Figure 9:
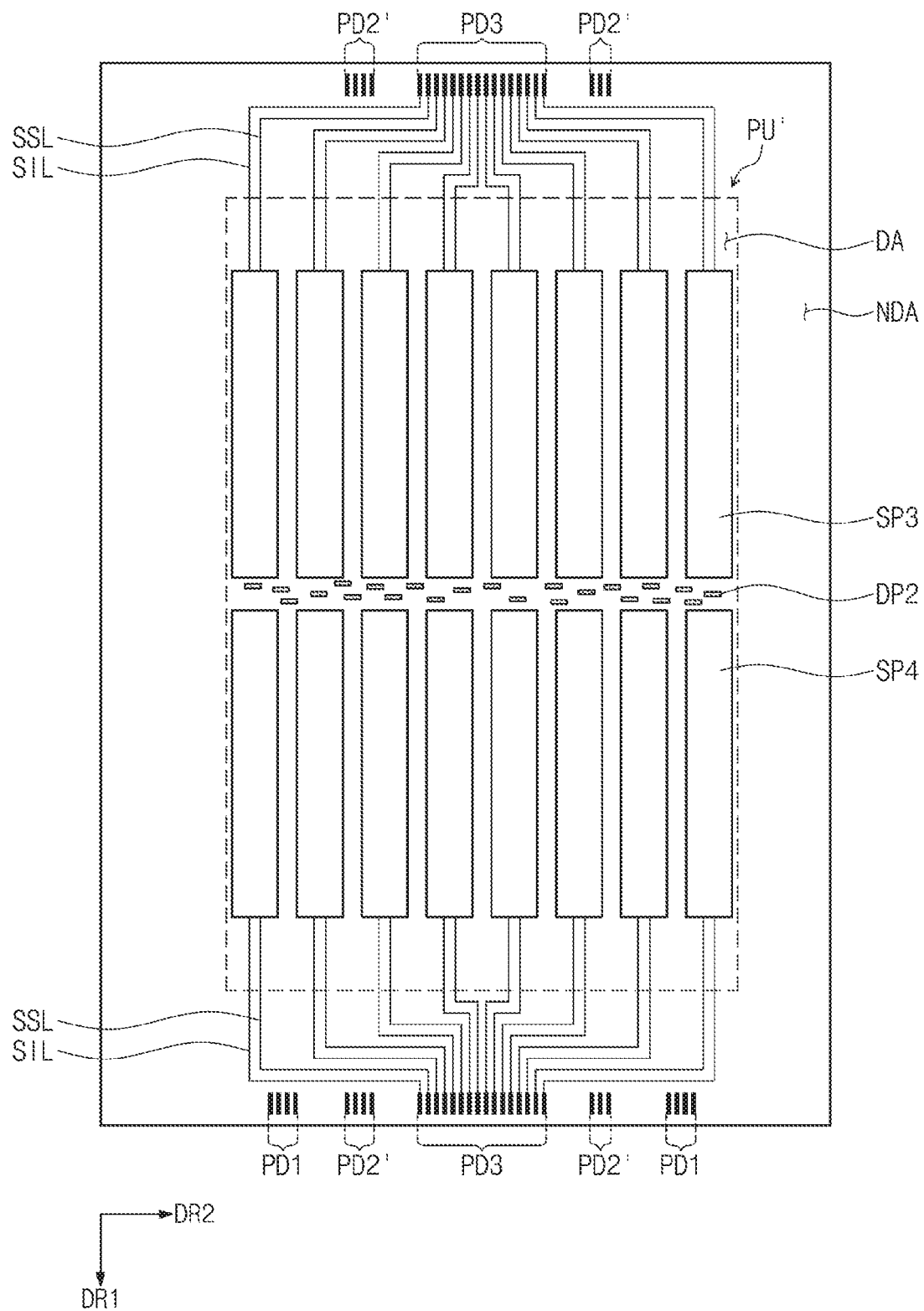
FIG. 9 is a schematic plan view of a second embodiment of a pressure sensing unit for use in a display device constructed according to the principles of the invention.

Referring to FIGS. 7 and 9, a plurality of the third sensing patterns SP3 may be provided. Although, in FIG. 9, the third sensing pattern SP3 is illustrated as having a rectangular shape in a plan view, the shape of the third sensing pattern SP3 is not limited to this example and may be different. The third sensing pattern SP3 may extend substantially throughout or over the entire region overlapped by both the display area DA and the first area NBA1.

A plurality of the fourth sensing patterns SP4 may be provided. Although, in FIG. 9, the fourth sensing pattern SP4 is illustrated as having a rectangular shape in a plan view, the shape of the fourth sensing pattern SP4 is not limited to this example and may be different. The fourth sensing pattern SP4 may extend substantially throughout or over the entire region overlapped by both the display area DA and the second area NBA2

The voltage input line SIL and the voltage sensing line SSL may extend from at least some or each of the third and fourth sensing patterns SP3 and SP4. The voltage input lines SIL and the voltage sensing lines SSL may overlap the non-display area NDA and may be used to electrically connect the third and fourth sensing patterns SP3 and SP4 to the third pad PD3.

The voltage input line SIL may be used to apply a voltage, which is generated by a voltage input circuit, to the third and fourth sensing patterns SP3 and SP4.

When there is a touch event from the outside, the third and fourth sensing patterns SP3 and SP4 may be deformed to cause a change in voltage level of the voltage. The changed voltage may be applied to a voltage sensing circuit through the voltage sensing line SSL.

The third and fourth sensing patterns SP3 and SP4 may be spaced apart from each other by a region overlapped with the bending area BA. For example, the third and fourth sensing patterns SP3 and SP4 might not be provided on the bending area BA, and this may make it possible to reduce or prevent the extent of deterioration in sensitivity of a sensing operation or an operational failure thereof, which may occur when the display device DD' is bent.

The second dummy pattern DP2 may be provided between the third and fourth sensing patterns SP3 and SP4. A plurality of the second dummy patterns DP2 may be arranged in a random or irregular manner, as shown in FIG. 9. For example, the second dummy patterns DP2 may be arranged in such a way that adjacent ones thereof are separated by at least two different distances. Although FIG. 9 illustrates an example in which each of the second dummy patterns DP2 has a rectangular shape in a plan view, the shape of the second dummy patterns DP2 is not limited to this example and may be different.

The second dummy pattern DP2 may be formed of, or include, at least one of indium tin oxide (ITO), indium zinc oxide (IZO), zinc oxide (ZnO), indium tin zinc oxide (ITZO), PEDOT, metal nano wire, or graphene, similar to the third and fourth sensing patterns SP3 and SP4, and the second dummy pattern DP2 may further include a metal layer formed of molybdenum, silver, titanium, copper, aluminum, or alloys thereof.

Since the third and fourth sensing patterns SP3 and SP4 are spaced apart from each other, there may be a difference in optical reflectance between the bending area BA and the first to second areas BA1 and BA2. However, by including the second dummy pattern DP2, it may become more difficult for a user to recognize patterns in the external light reflected by the sensors, which may otherwise be caused due to the difference in optical reflectance between the bending area BA and the first to second areas NBA1 and NBA2.

Figure 10:
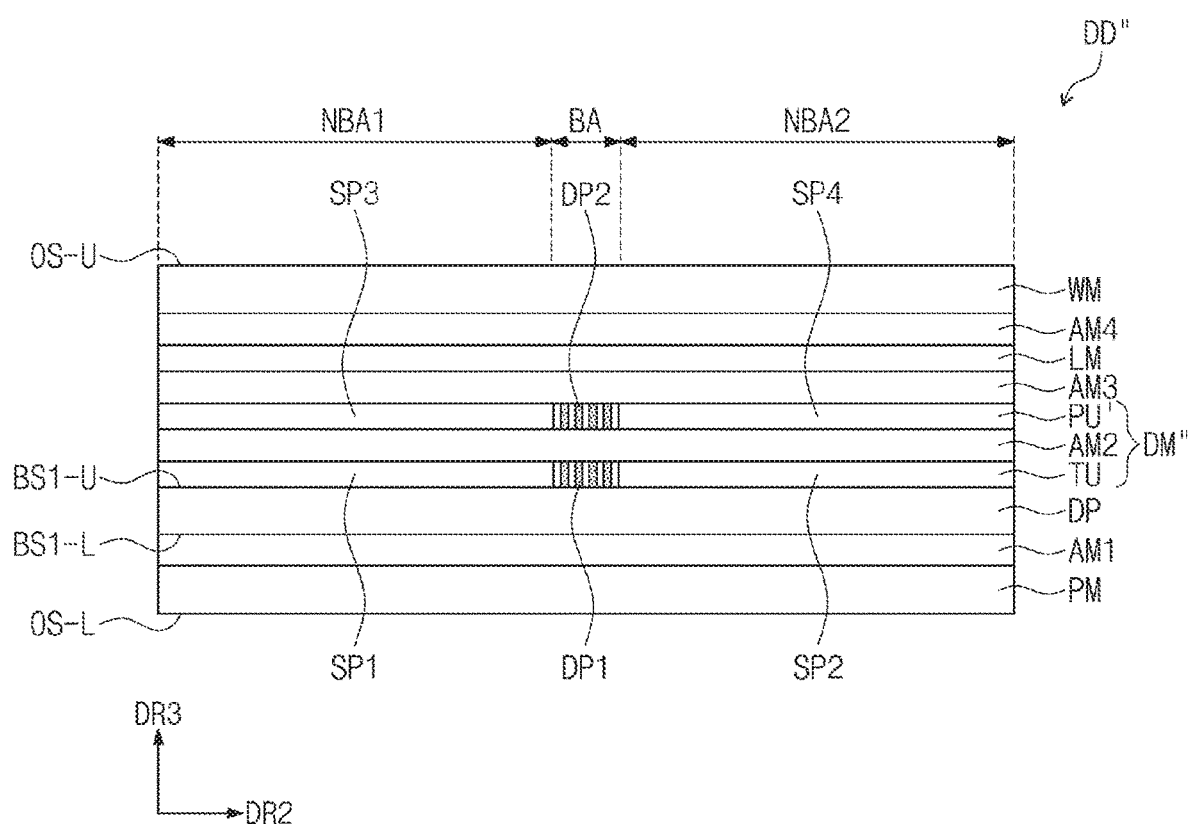
FIG. 10 is a sectional view of a third embodiment of a display device constructed according to the principles of the invention, including a fourth embodiment of a display module.

Referring to FIG. 10, the display device DD''' may include a display module DM'', in which the position sensing unit TU and the pressure sensing unit PU' are provided.

The position sensing unit TU may be substantially the same as the position sensing unit TU shown in FIG. 3.

The pressure sensing unit PU' may be substantially the same as the pressure sensing unit PU' shown in FIG. 7.

Except for these differences, the description of the other features of the display device DD'' may be substantially the same as the descriptions of those features of FIG. 3, and thus, redundant descriptions thereof will be omitted for the sake of brevity.

As shown in FIG. 10, the display module DM'' has both of the first and second dummy patterns DP1 and DP2. Thus, even when the separated arrangement of the sensing patterns SP1-SP4 leads to a difference in optical reflectance between the bending area BA and the first to second areas NBA1 and NBA2, it may be possible to more effectively prevent or suppress a user from being able to recognize patterns in the light reflected from the sensors as compared to the previously described embodiments of FIGS. 3 and 7.

According to the foregoing, a display device constructed according to the principles of the invention may include a first dummy pattern overlapped with a bending area. In addition, a first sensing pattern may be spaced apart from a second sensing pattern. Thus, it may be possible to realize a difference in optical reflectance between the bending area and a flat (i.e., non-bending) area. This makes it more difficult for a user to recognize patterns in the reflected light between these areas.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display device, comprising:
a display panel including a first area, a second area spaced from the first area, and a bending area disposed between the first and second areas;
a first sensing pattern corresponding to the first area;
a second sensing pattern spaced apart from the first sensing pattern and corresponding to the second area; and
a first non-functional pattern overlapped with the bending area and spaced apart from each of the first and second sensing patterns,
wherein:
the first non-functional pattern comprises a plurality of first dummy patterns arranged in an irregular manner; and
the first sensing pattern, the second sensing pattern, and the first non-functional pattern are disposed in the same layer.

2. The display device of claim 1, wherein the bending area is configured to be bendable about at least one bending axis, the first and second areas are substantially inflexible, and the first non-functional pattern is electrically disconnected from each of the first and second sensing patterns.

3. The display device of claim 1, further comprising:
a third sensing pattern overlapped with the first area; and
a fourth sensing pattern spaced apart from the third sensing pattern and overlapped with the second area,
wherein the third and fourth sensing patterns are disposed in the same layer.

4. The display device of claim 3, further comprising a second non-functional pattern overlapped with the bending area and spaced apart from each of the third and fourth sensing patterns
wherein the second non-functional pattern, the third sensing pattern, and the fourth sensing pattern are disposed in the same layer.

5. The display device of claim 4, wherein the second non-functional pattern is disposed over the first non-functional pattern.

6. The display device of claim 3, wherein the first and second sensing patterns are configured to sense a position of an external touch, and
the third and fourth sensing patterns are configured to sense pressure of the external touch.

7. The display device of claim 1, wherein the first non-functional pattern comprises substantially the same material as the first and second sensing patterns.

8. The display device of claim 1, wherein the first sensing pattern, the second sensing pattern, and the first dummy pattern are disposed in the same layer.

9. The display device of claim 1, wherein the first sensing pattern and the second sensing pattern do not overlap with the bending area.

10. A display device, comprising:
a display panel including a first area, a second area spaced from the first area, and a bending area disposed between the first and second areas;
a first sensing pattern corresponding to the first area;
a second sensing pattern spaced apart from the first sensing pattern and corresponding to the second area;
a first non-functional pattern overlapped with the bending area and spaced apart from each of the first and second sensing patterns; and
a pressure sensing pattern overlapped with the display panel,
wherein the first sensing pattern, the second sensing pattern, and the first non-functional pattern are disposed in the same layer.

11. The display device of claim 10, wherein the first and second sensing patterns are configured to sense a position of an external touch, and
the pressure sensing pattern is configured to sense pressure of the external touch.

12. The display device of claim 10, wherein the bending area is configured to be bendable about at least one bending axis, and
the first and second areas are configured to be substantially inflexible.

13. The display device of claim 10, wherein the first non-functional pattern comprises a plurality of first dummy patterns arranged in an irregular manner.

14. The display device of claim 10, wherein the pressure sensing pattern comprises:
a third sensing pattern overlapped with the first area;
a fourth sensing pattern spaced apart from the third sensing pattern and overlapped with the second area; and
a second non-functional pattern overlapped with the bending area and spaced apart from each of the third and fourth sensing patterns.

15. The display device of claim 14, wherein the third and fourth sensing patterns are configured to sense pressure of an external touch.

16. The display device of claim 14, wherein the second non-functional pattern comprises a plurality of second dummy patterns.

17. The display device of claim 16, wherein the second dummy patterns are arranged in an irregular manner.

18. The display device of claim 14, wherein the second non-functional dummy pattern, the third sensing pattern, and the fourth sensing pattern are disposed in the same layer.

* * * * *